(12) United States Patent
Cho et al.

(10) Patent No.: US 10,944,068 B2
(45) Date of Patent: Mar. 9, 2021

(54) ORGANIC LIGHT EMITTING DISPLAY APPARATUS

(71) Applicant: SAMSUNG DISPLAY CO., LTD., Yongin-si (KR)

(72) Inventors: Chi-O Cho, Yongin-si (KR); Byungchoon Yang, Yongin-si (KR); Young-Jun Seo, Yongin-si (KR); Won Sang Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/697,002

(22) Filed: Nov. 26, 2019

(65) Prior Publication Data

US 2020/0099004 A1 Mar. 26, 2020

Related U.S. Application Data

(63) Continuation of application No. 16/202,397, filed on Nov. 28, 2018, now Pat. No. 10,497,889, which is a
(Continued)

(30) Foreign Application Priority Data

Oct. 24, 2013 (KR) .................. 10-2013-0127431

(51) Int. Cl.
*H01L 51/50* (2006.01)
*H01L 51/52* (2006.01)
*H01L 27/32* (2006.01)

(52) U.S. Cl.
CPC .......... *H01L 51/502* (2013.01); *H01L 27/322* (2013.01); *H01L 27/3211* (2013.01);
(Continued)

(58) Field of Classification Search
CPC ............... H01L 51/502; H01L 51/5016; H01L 51/5212; H01L 51/5218; H01L 51/5221;
(Continued)

(56) References Cited

U.S. PATENT DOCUMENTS 5,909,081 A 6/1999 Eida et al.
6,608,439 B1 8/2003 Sokolik et al.
(Continued)

FOREIGN PATENT DOCUMENTS

CN 101176385 A 5/2008
CN 101622732 A 1/2010
(Continued)

OTHER PUBLICATIONS

Choy, Wallace C.H., et al., "Improving the viewing angle properties of microcavity OLEDs by using dispersive gratings", Optics Express, vol. 15, No. 20 (Oct. 1, 2007).
(Continued)

*Primary Examiner* — Ida M Soward
(74) *Attorney, Agent, or Firm* — Lewis Roca Rothgerber Christie LLP

(57) ABSTRACT

An organic light emitting display apparatus including a substrate including a plurality of pixel areas; a pixel electrode on the substrate; an opposite electrode on the pixel electrode, the opposite electrode transmitting light; an organic light emitting layer between the pixel electrode and the opposite electrode, the organic light emitting layer emitting a first light toward the opposite electrode; a light emitting layer on the opposite electrode, the light emitting layer absorbing a portion of the first light and emitting a second light; and a sealing layer on the light emitting layer, the sealing layer sealing the pixel electrode, the opposite electrode, the organic light emitting layer, and the light emitting layer.

13 Claims, 9 Drawing Sheets

Related U.S. Application Data continuation of application No. 15/958,726, filed on Apr. 20, 2018, now Pat. No. 10,236,463, which is a continuation of application No. 15/439,602, filed on Feb. 22, 2017, now Pat. No. 9,978,973, which is a continuation of application No. 14/933,856, filed on Nov. 5, 2015, now Pat. No. 9,583,727, which is a continuation of application No. 14/446,746, filed on Jul. 30, 2014, now Pat. No. 9,184,403.

(52) U.S. Cl.
 CPC ...... *H01L 51/5016* (2013.01); *H01L 51/5212* (2013.01); *H01L 51/5218* (2013.01); *H01L 51/5221* (2013.01); *H01L 51/5234* (2013.01); *H01L 51/5253* (2013.01); *H01L 51/5281* (2013.01); *H01L 27/326* (2013.01); *H01L 2251/301* (2013.01); *H01L 2251/305* (2013.01); *H01L 2251/308* (2013.01); *H01L 2251/5315* (2013.01); *H01L 2251/5369* (2013.01)

(58) Field of Classification Search
 CPC ............. H01L 51/5234; H01L 51/5253; H01L 51/5281; H01L 27/3211; H01L 27/322
 See application file for complete search history.

(56) References Cited

U.S. PATENT DOCUMENTS

| | | | |
|---|---|---|---|
| 6,953,717 B2 | 10/2005 | Arai et al. | |
| 7,147,530 B2 | 12/2006 | Yamazaki et al. | |
| 7,321,194 B2 | 1/2008 | Kondo et al. | |
| 7,400,088 B2 | 7/2008 | Ryu | |
| 7,420,210 B2 | 9/2008 | Yamazaki et al. | |
| 7,449,351 B2 | 11/2008 | Yamada | |
| 7,501,653 B2 | 3/2009 | Arai et al. | |
| 7,719,014 B2 | 5/2010 | Yamazaki et al. | |
| 7,812,520 B2 | 10/2010 | Nomura et al. | |
| 7,839,081 B2 | 11/2010 | Kubota et al. | |
| 7,867,053 B2 | 1/2011 | Fukunaga et al. | |
| 7,876,037 B2 | 1/2011 | Koshihara et al. | |
| 7,897,979 B2 | 3/2011 | Yamazaki et al. | |
| 7,942,715 B2 * | 5/2011 | Ishihara | H01L 27/3276 445/24 |
| 7,982,206 B2 | 7/2011 | Yamazaki et al. | |
| 8,174,034 B2 | 5/2012 | Bogner et al. | |
| 8,222,116 B2 | 7/2012 | Jinbo et al. | |
| 8,227,294 B2 | 7/2012 | Maekawa | |
| 8,242,515 B2 | 8/2012 | Kahen et al. | |
| 8,378,101 B2 | 2/2013 | Nomura et al. | |
| 8,445,901 B2 | 5/2013 | Maekawa | |
| 8,643,270 B2 | 2/2014 | Yamazaki et al. | |
| 8,710,527 B2 | 4/2014 | Moon et al. | |
| 8,772,762 B2 | 7/2014 | Kaneta et al. | |
| 8,796,914 B2 | 8/2014 | Fujita et al. | |
| 8,809,891 B2 | 8/2014 | Ikeda et al. | |
| 8,860,034 B2 | 10/2014 | Prushinskiy et al. | |
| 8,921,872 B2 | 12/2014 | Ichikawa et al. | |
| 8,926,915 B2 | 1/2015 | Park et al. | |
| 8,933,319 B2 | 1/2015 | Mitsui et al. | |
| 8,957,578 B2 | 2/2015 | Lee | |
| 8,987,712 B2 | 3/2015 | Saito et al. | |
| 9,041,629 B2 * | 5/2015 | Yokoyama | G02F 1/133555 345/76 |
| 9,076,990 B2 | 7/2015 | Nakamura et al. | |
| 9,105,855 B2 | 8/2015 | Ikeda et al. | |
| 9,337,244 B2 | 5/2016 | Hatano et al. | |
| 9,515,290 B2 | 12/2016 | Lim et al. | |
| 9,917,141 B2 | 3/2018 | Yamazaki | |
| 2002/0175619 A1 | 11/2002 | Kita et al. | |
| 2006/0046334 A1 | 3/2006 | Yamazaki et al. | |
| 2006/0220509 A1 | 10/2006 | Ghosh et al. | |
| 2007/0007527 A1 | 1/2007 | Koyama | |
| 2007/0024168 A1 | 2/2007 | Nishimura et al. | |
| 2007/0026580 A1 | 2/2007 | Fujii | |
| 2007/0031990 A1 | 2/2007 | Maekawa | |
| 2007/0098879 A1 | 5/2007 | Makiura | |
| 2007/0228367 A1 * | 10/2007 | Nakamura | H01L 51/5265 257/40 |
| 2008/0048562 A1 | 2/2008 | Matsuda | |
| 2009/0021148 A1 | 1/2009 | Hachiya et al. | |
| 2009/0101904 A1 | 4/2009 | Yamamoto et al. | |
| 2010/0051973 A1 | 3/2010 | Kobayashi et al. | |
| 2010/0148157 A1 | 6/2010 | Song et al. | |
| 2010/0219429 A1 | 9/2010 | Cok et al. | |
| 2010/0283385 A1 * | 11/2010 | Maeda | H01L 51/5265 313/504 |
| 2011/0108812 A1 * | 5/2011 | Sumita | H01L 27/326 257/40 |
| 2012/0299035 A1 | 11/2012 | Ikeda et al. | |
| 2013/0002127 A1 | 1/2013 | Jeong et al. | |
| 2013/0037828 A1 | 2/2013 | Moon et al. | |
| 2013/0075709 A1 | 3/2013 | Koyama | |
| 2013/0076231 A1 | 3/2013 | Nakanisha et al. | |
| 2013/0134450 A1 | 5/2013 | Chang et al. | |
| 2013/0337595 A1 | 12/2013 | Tsuchiya | |
| 2014/0028181 A1 | 1/2014 | Lee et al. | |
| 2014/0145220 A1 | 5/2014 | Seo et al. | |
| 2014/0339578 A1 | 11/2014 | Jinbo et al. | |
| 2015/0155338 A1 | 6/2015 | Im et al. | |
| 2017/0141336 A1 | 5/2017 | Zhou et al. | |
| 2019/0189968 A1 * | 6/2019 | Song | H01L 51/5246 |

FOREIGN PATENT DOCUMENTS

| | | |
|---|---|---|
| JP | 2007-207633 A | 8/2007 |
| JP | 2010-129452 A | 6/2010 |
| JP | 2013-137931 A | 7/2013 |
| KR | 10-2008-0007247 A | 1/2008 |
| KR | 10-2011-0058579 A | 6/2011 |
| KR | 10-2012-0107349 A | 10/2012 |
| KR | 10-2013-0073808 A | 7/2013 |
| KR | 10-2013-0111483 A | 10/2013 |

OTHER PUBLICATIONS

Korean Intellectual Property Office Notice of Allowance for corresponding Korean Patent Application No. 10-2013-0127431, dated Apr. 27, 2020, 5 pages.

* cited by examiner

ORGANIC LIGHT EMITTING DISPLAY APPARATUS

CROSS-REFERENCE TO RELATED APPLICATIONS

This application is a continuation of U.S. patent application Ser. No. 16/202,397, filed Nov. 28, 2018, which is a continuation of U.S. patent application Ser. No. 15/958,726, filed Apr. 20, 2018, now U.S. Pat. No. 10,236,463, which is a continuation of U.S. patent application Ser. No. 15/439,602, filed Feb. 22, 2017, now U.S. Pat. No. 9,978,973, which is a continuation of U.S. patent application Ser. No. 14/933,856, filed Nov. 5, 2015, now U.S. Pat. No. 9,583,727, which is a continuation of U.S. patent application Ser. No. 14/446,746, filed Jul. 30, 2014, now U.S. Pat. No. 9,184,403, which claims priority to and the benefit of Korean Patent Application No. 10-2013-0127431, filed Oct. 24, 2013, the entire content of all of which is incorporated herein by reference.

BACKGROUND

1. Field

Embodiments relate to an organic light emitting display apparatus.

2. Description of the Related Art

An organic light emitting display apparatus includes an organic light emitting device that may include a hole injection electrode, an electron injection electrode, and an organic light emitting layer between the hole injection electrode and the electron injection electrode. For example, holes and electrons injected into the organic light emitting layer may be recombined in the organic light emitting layer to generate excitons, and the organic light emitting device may emit light by the excitons that return to a ground state from an excited state. For example, the organic light emitting display apparatus is a self-emissive display apparatus.

SUMMARY

Embodiments are directed to an organic light emitting display apparatus.

The embodiments may be realized by providing an organic light emitting display apparatus including a substrate including a plurality of pixel areas; a pixel electrode on the substrate; an opposite electrode on the pixel electrode, the opposite electrode transmitting light; an organic light emitting layer between the pixel electrode and the opposite electrode, the organic light emitting layer emitting a first light toward the opposite electrode; a light emitting layer on the opposite electrode, the light emitting layer absorbing a portion of the first light and emitting a second light; and a sealing layer on the light emitting layer, the sealing layer sealing the pixel electrode, the opposite electrode, the organic light emitting layer, and the light emitting layer.

The light emitting layer may include at least one of an organic light emitting material, a phosphor, or a quantum dot.

The light emitting layer may include the phosphor, the phosphor including at least one of a nano-phosphor, a silicate phosphor, a nitride phosphor, or a sulfide phosphor.

The light emitting layer may include the quantum dot, the quantum dot including at least one of a CdSe core/ZnS shell, a CdSe core/CdS shell, or a InP core/ZnS shell.

The second light may have no directivity.

The first light may include a first incident light that is incident on the light emitting layer in a direction that is perpendicular to an interface between the organic light emitting layer and the light emitting layer, and a second incident light that is incident on the light emitting layer in a direction that is inclined with respect to the interface, and the second light may include a first output light that is emitted in response to the first incident light, and a second output light that is emitted in response to the second incident light.

The first output light may have a wavelength band that is red shifted when compared to the first incident light, and the second output light may have a wavelength band that is red shifted when compared to the second incident light.

A difference in a wavelength band between the second incident light and the second output light may be greater than a difference in a wavelength band between the first incident light and the first output light.

A difference in a peak wavelength between the second incident light and the second output light may be greater than a difference in a peak wavelength between the first incident light and the first output light.

A difference in a peak wavelength between a front light constituting a portion of the second light that is obtained from the first incident light and an inclined light constituting a remaining portion of the second light that is obtained from the second incident light may be smaller than a difference in peak wavelength between the first incident light and the second incident light.

The pixel areas may include a red pixel area, a green pixel area, and a blue pixel area, the organic light emitting layer may include a first organic light emitting layer in the red pixel area, a second organic light emitting layer in the green pixel area, and a third organic light emitting layer in the blue pixel area, and the light emitting layer may include a first light emitting layer in the red pixel area, a second light emitting layer in the green pixel area, and a third light emitting layer in the blue pixel area.

The first organic light emitting layer may include a material that emits light having a red color, the first organic light emitting layer having a quantum efficiency that compensates for a color shift caused by a side viewing angle of the red color, the second organic light emitting layer may include a material that emits light having a green color, the second organic light emitting layer having a quantum efficiency that compensates for a color shift caused by a side viewing angle of the green color, and the third organic light emitting layer may include a material that emits light having a blue color, the third organic light emitting layer having a quantum efficiency that compensates for a color shift caused by a side viewing angle of the blue color.

The first, second, and third organic light emitting layers may include a material emitting a blue color, the first light emitting layer may have a quantum efficiency that compensates for a blue color shift caused by a side viewing angle, the second light emitting layer may have a quantum efficiency that compensates for the blue color shift and a wavelength difference between red and green colors, and the third light emitting layer may have a quantum efficiency that compensates for the blue color shift and a wavelength difference between the red and blue colors.

The pixel electrode may include a reflective electrode and a transmissive electrode.

The reflective electrode may include Ag, Mg, Al, Pt, Pd, Au, Ni, Nd, Ir, Cr, or a compound thereof, and the transmissive electrode may include at least one selected from the group of indium tin oxide (ITO), indium zinc oxide (IZO), zinc oxide (ZnO), indium oxide ($In_2O_3$), indium gallium oxide (IGO), or aluminum zinc oxide (AZO).

The opposite electrode may include Li, Ca, LiF/Ca, LiF/Al, Al, Ag, Mg, or a compound thereof.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
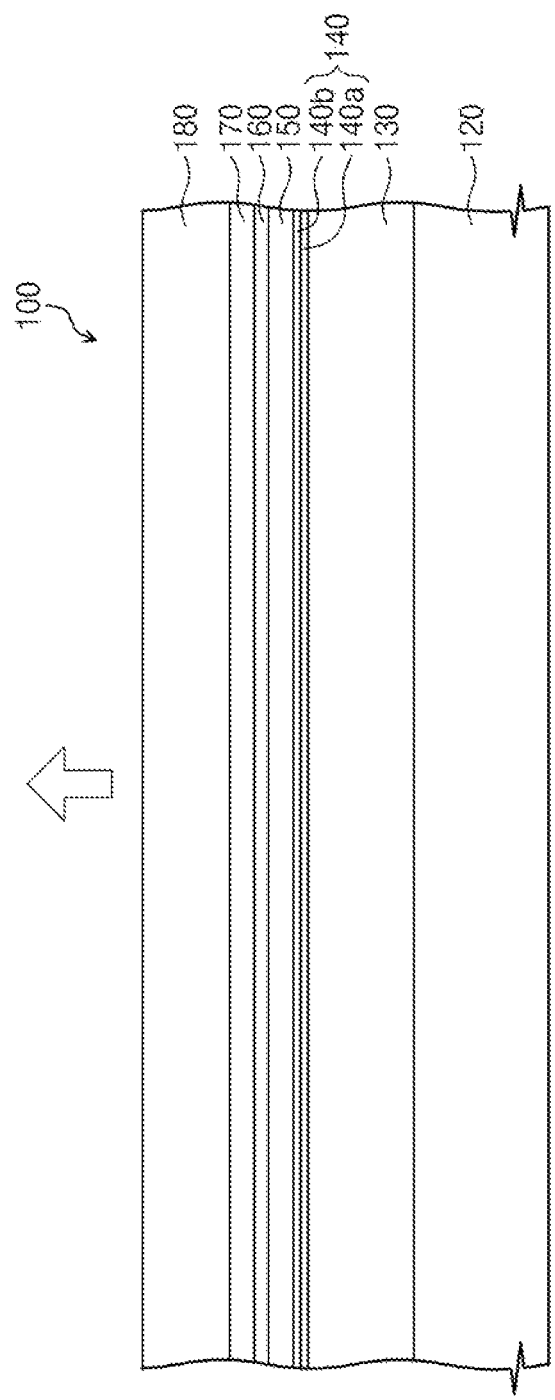
FIG. 1 illustrates a cross-sectional view showing an organic light emitting display apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this application belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
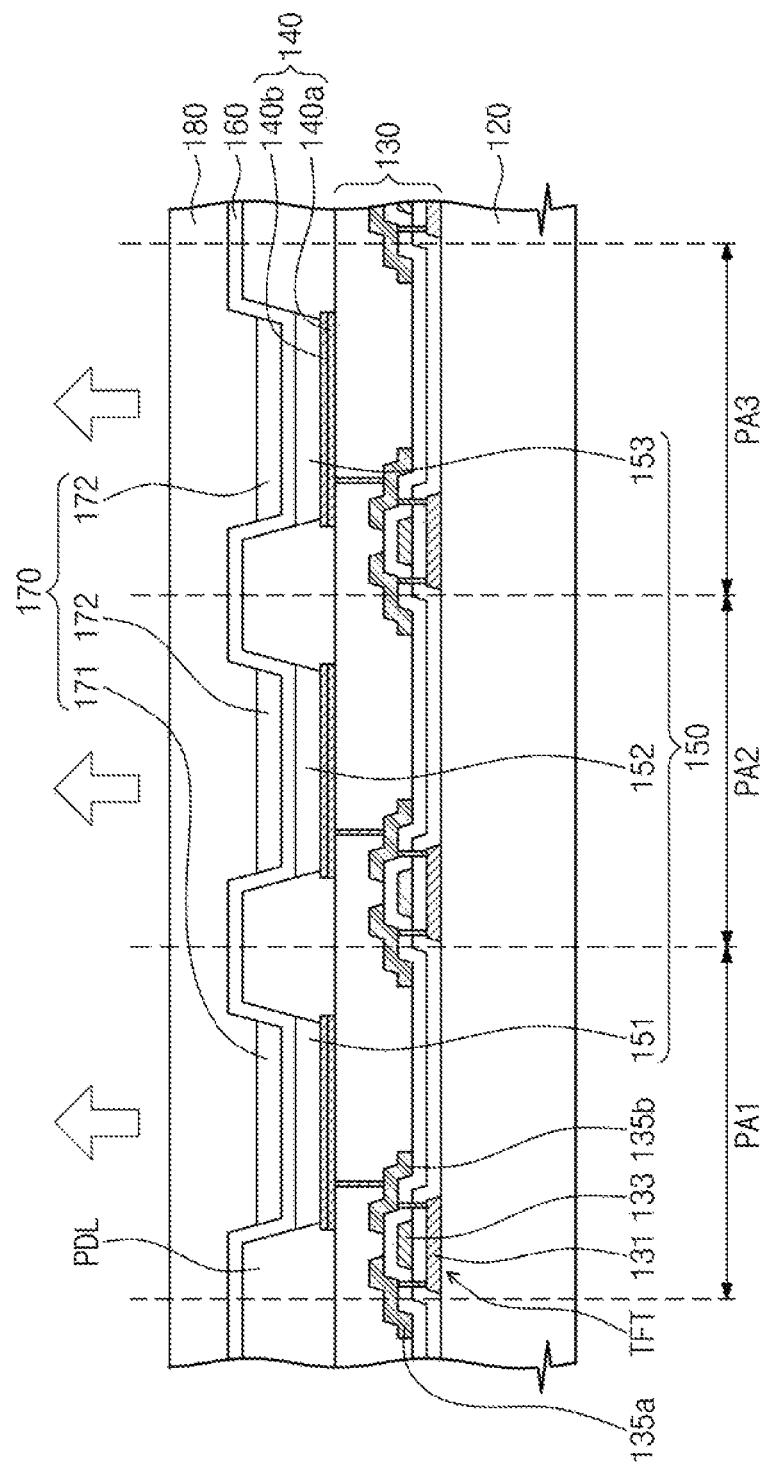
FIG. 2 illustrates a cross-sectional view showing three pixel areas of the organic light emitting display apparatus of FIG. 1.

FIG. 1 illustrates a cross-sectional view showing an organic light emitting display apparatus 100 according to an exemplary embodiment. FIG. 2 illustrates a cross-sectional view showing three pixel areas of the organic light emitting display apparatus 100 of FIG. 1.

Referring to FIGS. 1 and 2, the organic light emitting display apparatus 100 may include a substrate 120, a pixel electrode 140, an organic light emitting layer 150, an opposite electrode 160, a light emitting layer 170, and a sealing layer 180.

The substrate 120 may be a flexible substrate. For example, the substrate 120 may include a plastic material having high thermal resistance and high durability, such as polyethylene terephthalate, polyethylene naphthalate, polycarbonate, polyarylate, polyetherimide, polyethersulfone, polyimide, or the like. In an implementation, the substrate 120 may include, e.g., a metal material or a glass material.

A device/line layer 130 may be disposed on the substrate 120, and may include a driving thin film transistor TFT connected to the pixel electrode 140, a switching thin film transistor (not shown), a capacitor, and lines (not shown). The lines may be connected between the driving thin film transistor, the switching thin film transistor, and the capacitor.

The driving thin film transistor TFT may include an active layer 131, a gate electrode 133, a source electrode 135a, and a drain electrode 135b.

A barrier layer (not shown) may be provided between the substrate 120 and the device/line layer 130 to help prevent a foreign substance, e.g., moisture, oxygen, or the like, from entering into the organic light emitting layer 150 after passing through the substrate 120.

The organic light emitting display apparatus 100 may include a plurality of pixel areas PA1, PA2, and PA3, and a pixel definition layer PDL may be between the pixel areas PA1, PA2, and PA3. The pixel areas PA1, PA2, and PA3 may include, e.g., a first pixel area PA1 emitting a red light, a second pixel area PA2 emitting a green light, and a third pixel area PA3 emitting a blue light.

The pixel electrode 140 may be on the device/line layer 130. The pixel electrode 140 may correspond to each of the first, second, and third pixel areas PA1, PA2, and PA3. For example, the first pixel area PA1 may include a pixel electrode 140, the second pixel area PA2 may include a pixel electrode 140, and the third pixel area PA3 may include a pixel electrode 140. The opposite electrode 160 may be on the pixel electrode 140, and the organic light emitting layer 150 may be between the pixel electrode 140 and the opposite electrode 160.

In an implementation, the pixel electrode 140 may serve as an anode, and the opposite electrode 160 may serve as a cathode. In an implementation, and according to a driving method of the organic light emitting display apparatus 100, the pixel electrode 140 may serve as the cathode and the opposite electrode 160 may serve as the anode. Holes and electrons, which may be injected into the organic light emitting layer 150 from the pixel electrode 140 and the opposite electrode 160, may be recombined in the organic light emitting layer 150 to generate excitons. The organic light emitting layer 150 may emit a first light when the excitons return to a ground state from an excited state.

FIG. 2 illustrates an example of a structure of the device/line layer 130. For example, an arrangement of the active layer 131, the gate electrode 133, the source electrode 135a, and the drain electrode 135b may be varied. For example, as opposed to the gate electrode 133 being on the active layer 131 (as shown in FIG. 2), in an implementation, the gate electrode 133 may be under the active layer 131.

The pixel electrode 140 may include, e.g., a reflective electrode 140a and a transmissive electrode 140b. The reflective electrode 140a may include, e.g., Ag, Mg, Al, Pt, Pd, Au, Ni, Nd, Ir, Cr, or a compound thereof. The transmissive electrode 140b may be transparent or semi-transparent, and may include, e.g., at least one selected from the group of indium tin oxide (ITO), indium zinc oxide (IZO), zinc oxide (ZnO), indium oxide ($In_2O_3$), indium gallium oxide (IGO), or aluminum zinc oxide (AZO).

The opposite electrode 160 may be transparent or semi-transparent, and my include, e.g., a metal thin layer having a low work function. The opposite electrode 160 may include, e.g., Li, Ca, LiF/Ca, LiF/Al, Al, Ag, Mg, or a compound thereof. In an implementation, the opposite electrode 160 may further include a material used to form a transparent electrode, e.g., ITO, IZO, ZnO, $In_2O_3$, or the lie, which may be disposed on the metal thin layer. The opposite electrode 160 may transmit light emitted from the organic light emitting layer 150.

The organic light emitting layer 150 may include, e.g., a low molecular organic material or a high molecular organic material. The organic light emitting layer 150 may include, e.g., first, second, and third organic light emitting layers 151, 152, and 153 in the first, second, and third pixel areas PA1, PA2, and PA3, respectively.

An intermediate layer, e.g., a hole transport layer, a hole injection layer, an electron transport layer, an electron injection layer, or the like, may be selectively disposed between the pixel electrode 140 and the opposite electrode 160, in addition to the organic light emitting layer 150.

Light emitted from the organic light emitting layer 150 may be reflected by the pixel electrode 140 and may exit or be transmitted through the opposite electrode 160. For example, the organic light emitting display apparatus 100 may be a front surface light emitting type organic light emitting display apparatus 100.

The sealing layer 180 may be on the light emitting layer 170 to help prevent the pixel electrode 140, the organic light emitting layer 150, the opposite electrode 160, and the light emitting layer 170 from being exposed to external moisture and/or oxygen, e.g., the sealing layer 180 may seal the pixel electrode 140, the organic light emitting layer 150, the opposite electrode 160, and the light emitting layer 170.

The light emitting layer 170 may be on the opposite electrode 160. The light emitting layer 170 may include, e.g., first, second, and third light emitting layers 171, 172 and 173 in the first, second, and third pixel areas PA1, PA2, and PA3, respectively.

The light emitting layer 170 may absorb a portion of a first light (emitted from the organic light emitting layer 150) to generate a second light.

The light emitting layer 170 may include a light emitting material, e.g., an organic light emitting material, a phosphor, or a quantum dot. The phosphor may include, e.g., at least one of a nano-phosphor, a silicate phosphor, a nitride phosphor, or a sulfide phosphor. The quantum dot may include, e.g., at least one of CdSe core/ZnS shell, CdSe core/CdS shell, and InP core/ZnS shell.

When an excited or first light, e.g., a blue excited light (having a high energy level that causes a light emission phenomenon), is incident to or on the light emitting layer 170, the second light (having a long-wavelength band or low energy wavelength band, which is in proportion to absorbancy and light emission quantum efficiency of the light emitting layer 170), may be generated by or in response to the excited or first light.

The second light emitted from the light emitting layer 170 may have no directivity.

Figure 3:
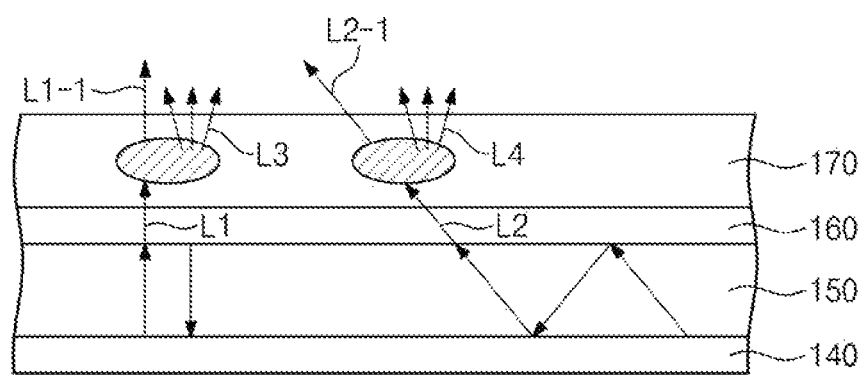
FIG. 3 illustrates a view showing a light emission mechanism of a second light emitted from a light emitting layer.

FIG. 3 illustrates a view showing a light emission mechanism of the second light emitted from the light emitting layer 170. FIG. 3 shows the pixel electrode 140, the organic light emitting layer 150, the opposite electrode 160, and the light emitting layer 170.

Referring to FIG. 3, the first light may include, e.g., an incident light directly exiting from the front surface of the organic light emitting layer 150 or exiting from the front surface of the organic light emitting layer 150 after being reflected by the pixel electrode 140 and the opposite electrode 160. The incident light may include, e.g., a first incident light L1 that is incident to or on the light emitting layer 170 in a direction that is substantially vertical or perpendicular to an interface between layers (e.g., between the opposite electrode 160 and the light emitting layer 170), and a second incident light L2 that is incident to or on the light emitting layer 170 in a direction that is inclined relative to the interface.

The structure in which the pixel electrode 140 faces the opposite electrode 160 and the organic light emitting layer 150 is between the pixel electrode 140 and the opposite electrode 160 corresponds to a metal-insulator-metal cavity model. The first light generated in the metal-insulator-metal cavity model may have a wavelength in accordance with or determined by an output angle thereof. For example, as a horizontal component of the first light becomes greater than a vertical component of the first light, or as the output angle becomes large, the wavelength of the first light may become shorter and may move or shift to a blue wavelength side. A blue color shift may occur in the image perceived by the user as the viewing angle becomes large.

The first incident light L1 may be incident to or on the light emitting layer 170, and a first partial light L1-1 (corresponding to a portion of the first incident light L1) may exit from the front surface (e.g., may be transmitted) at an output angle that is the same as the incident angle of the first incident light L1 after passing through the light emitting layer 170. A remaining portion of the first incident light L1 may be absorbed by the light emitting layer 170. The light emitting layer 170 may emit a first output light L3 on the basis of or in response to the absorbed remaining portion of the first incident light L1. The first output light L3 may have no directivity.

The second incident light L2 may be incident to or on the light emitting layer 170, and a second partial light L2-1 (corresponding to a portion of the second incident light L2) may exit from the front surface (e.g., may be transmitted) at an output angle that is the same as an incident angle of the second incident light L2 after passing through the light emitting layer 170. A remaining portion of the second incident light L2 may be absorbed by the light emitting layer 170. The light emitting layer 170 may emit a second output light L4 on the basis of or in response to the absorbed remaining portion of the second incident light L2. The second output light L4 may have no directivity.

The wavelength of the second incident light L2 may be shorter than the wavelength of the first incident light L1, and the first incident light L1 may include more light having high energy (e.g., that causes a light emission phenomenon of the light emitting layer 170) than that of the second incident light L2. For example, the second incident light L2 may have a constant incident angle, and thus the second incident light L2 may pass through the light emitting layer 170 through a light path that is longer than a light path (through the light emitting layer) of the first incident light L1 that is incident perpendicular to the interface of the light emitting layer 170 and another layer. Accordingly, the light emitting layer 170 may absorb more of the second incident light L2 than the first incident light L1.

The first and second output lights L3 and L4 may each have a wavelength band shifted to the red color, when respectively compared to the first and second incident lights L1 and L2.

A difference in the wavelength band between the second incident light L2 and the second output light L4 may be greater than a difference in the wavelength band between the first incident light L1 and the first output light L3. This may be because the output lights L3 and L4 may have the wavelength that is more shifted to the red color than the incident lights L1 and L2, as the amount of the incident lights L1 and L2 that is absorbed by the light emitting layer 170 is increased, and the second incident light L2 is absorbed to a greater degree by the light emitting layer 170 than the first incident light L1.

The light emitting layer 170 may allow the wavelength band of the second output light L4 to be shifted to a greater degree to the red color than the first output light L3. Thus, the blue color shift in the image perceived by the user may be improved, e.g., may be compensated for. For example, the image viewed from a side or wide viewing angle of the display may appear to be the same (e.g., same colors) as the image viewed from the front of the display.

In the present exemplary embodiment, the first, second, and third organic light emitting layers 151, 152, and 153 may include, e.g., red, green, and blue phosphor materials, respectively. In an implementation, the first, second, and third light emitting layers 171, 172, and 173 may include different materials from each other. For example, the first, second, and third light emitting layers 171, 172, and 173 may have the quantum efficiency that compensates for the color shift due to the side viewing angle in red, green, and blue colors, respectively.

In an implementation, all of the first, second, and third organic light emitting layers 151, 152, and 153 may include the blue phosphor material. For example, the first light emitting layer 171 may have the quantum efficiency that compensates for the blue color shift caused by the side viewing angle, the second light emitting layer 172 may have the quantum efficiency that compensates for the blue color shift and the wavelength difference between the red and green colors, and the third light emitting layer 173 may have the quantum efficiency that compensates for the blue color shift and the wavelength difference between the red and blue colors.

Figure 4A:
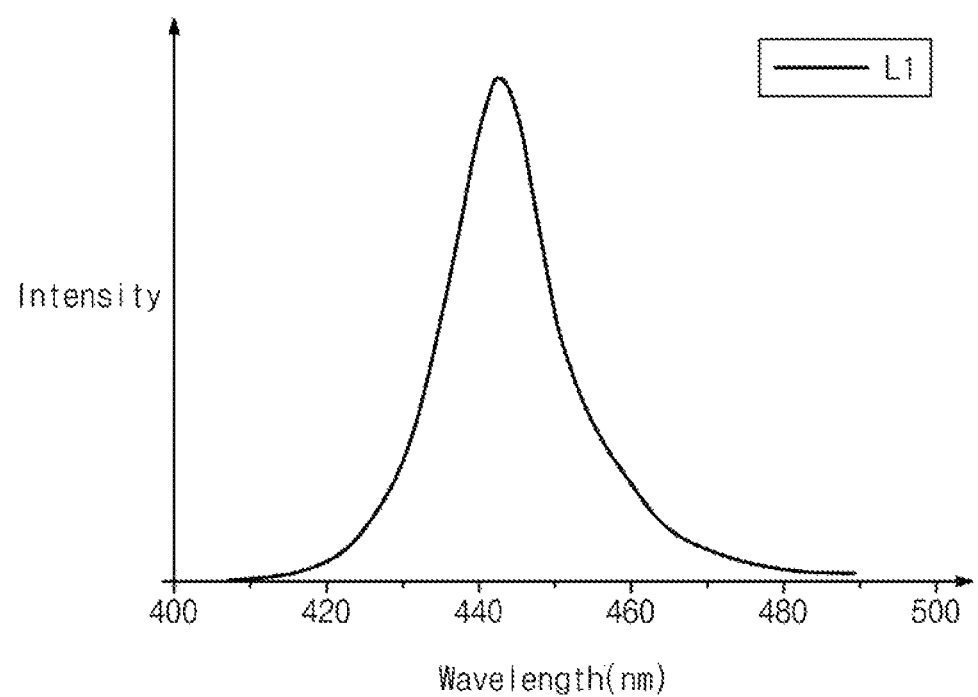
FIG. 4A illustrates a graph showing an intensity of a first incident light as a function of a wavelength of the first incident light.
Figure 4B:
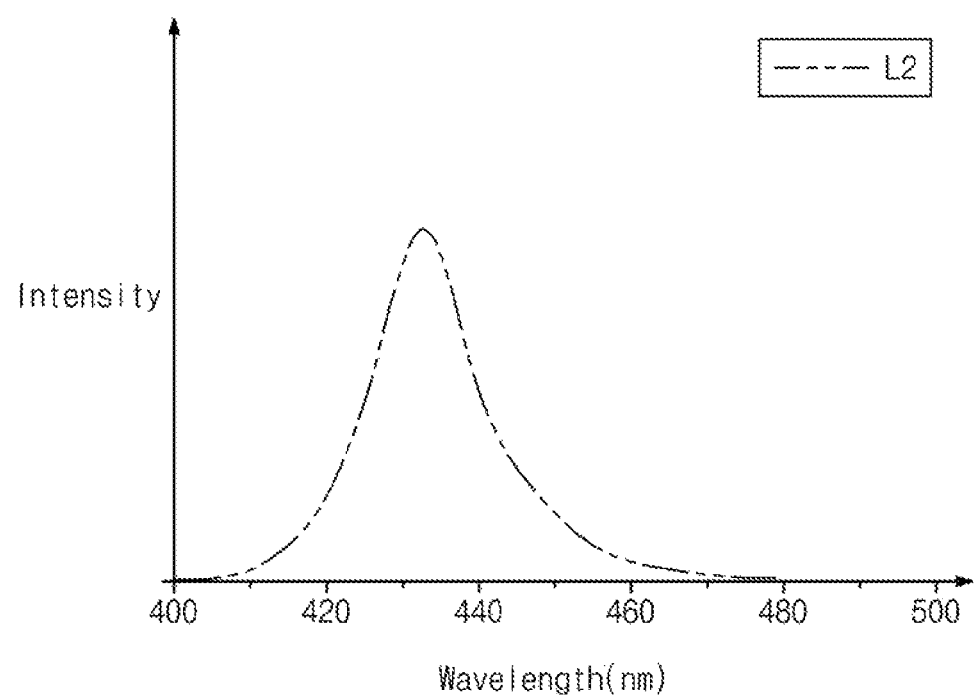
FIG. 4B illustrates a graph showing an intensity of a second incident light as a function of a wavelength of the second incident light.
Figure 4C:
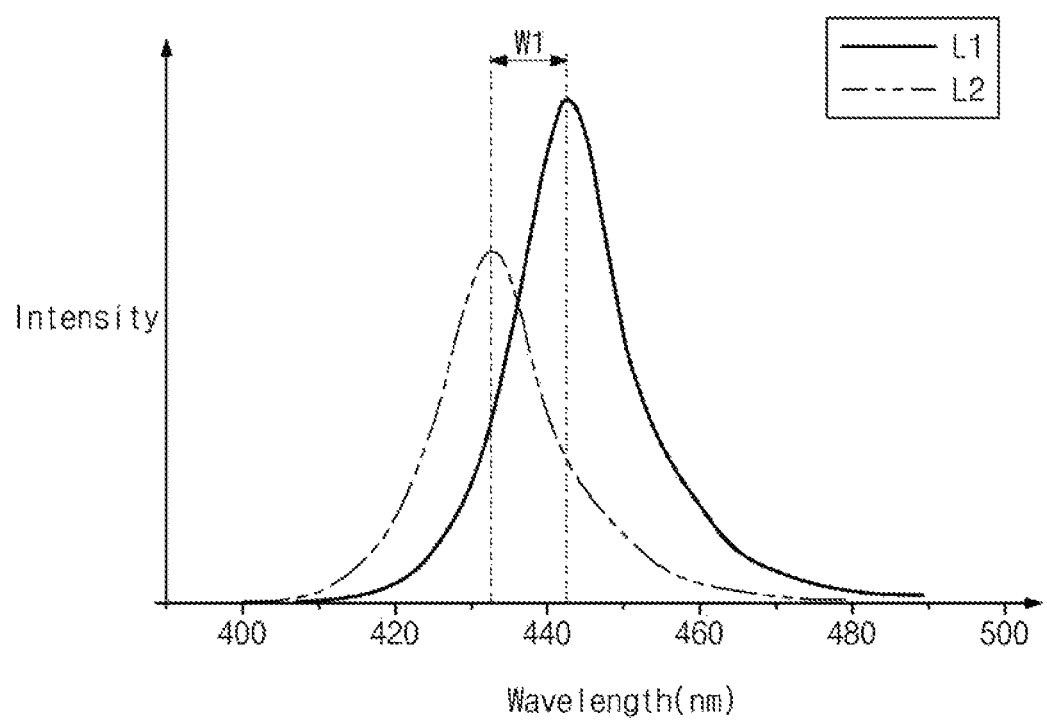
FIG. 4C illustrates a graph showing intensities of the first and second incident lights.

FIG. 4A illustrates a graph showing an intensity of the first incident light as a function of the wavelength of the first incident light, FIG. 4B illustrates a graph showing an intensity of the second incident light as a function of the wavelength of the second incident light, and FIG. 4C illustrates a graph showing the intensities of the first and second incident lights.

Figure 5A:
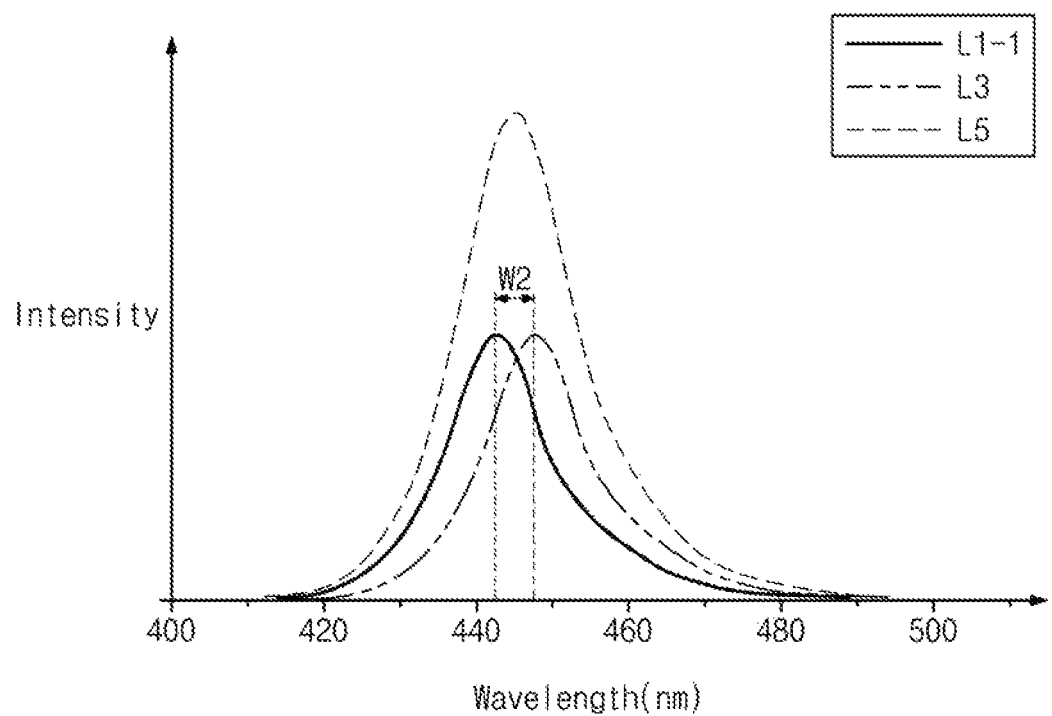
FIG. 5A illustrates a graph showing intensities of a first partial light, a first output light, and a front light obtained by mixing the first partial light and the first output light.
Figure 5B:
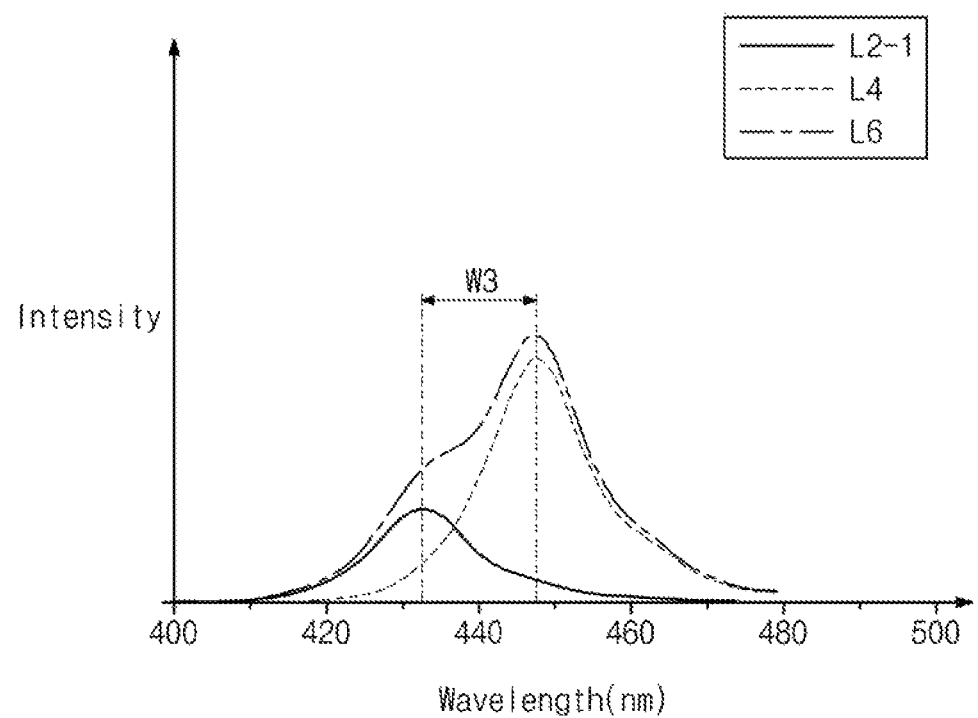
FIG. 5B illustrates a graph showing intensities of a second partial light, a second output light, and an inclined light obtained by mixing the second partial light and the second output light.
Figure 5C:
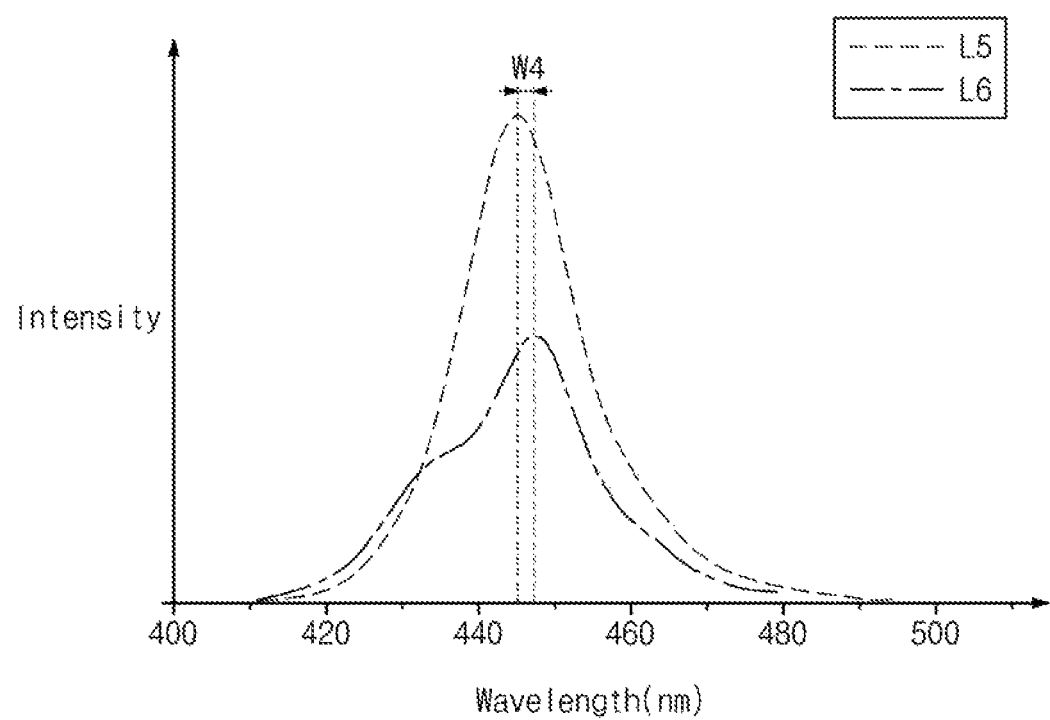
FIG. 5C illustrates a graph showing the front light of FIG. 5A and the inclined light of FIG. 5B.

FIG. 5A illustrates a graph showing intensities of the first partial light, the first output light, and a front light obtained by mixing the first partial light and the first output light, FIG. 5B illustrates a graph showing intensities of the second partial light, the second output light, and an inclined light obtained by mixing the second partial light and the second output light, and FIG. 5C illustrates a graph showing the front light shown in FIG. 5A and the inclined light shown in FIG. 5B.

Hereinafter, a wavelength value at a maximum intensity is referred to as a peak wavelength in FIGS. 4A to 4C and 5A to 5C.

Referring to FIGS. 3, 4A, and 4B, the wavelength band of the second incident light L2 may be more biased to a shorter wavelength, e.g., blue, than that of the first incident light L1. Thus, if the light emitting layer 170 (refer to FIGS. 1 to 3) were to be omitted, the blue color shift could occur in the image perceived by the user according to the viewing angle, e.g., when viewing from the side. Referring to FIG. 4C, a first difference W1 may exist between the peak wavelength of the first incident light L1 and the peak wavelength of the second incident light L2. For example, the first difference W1 may be about 10 nm.

Referring to FIGS. 3, 4A, and 5A, the peak wavelength of the first partial light L1-1 may be the same as the peak wavelength of the first incident light L1. The peak wavelength of the first output light L3 may be more biased to a longer wavelength, e.g., red, than the peak wavelength of the first incident light L1. A second difference W2 may exist between the peak wavelength of the first partial light L1-1 and the peak wavelength of the first output light L3.

Referring to FIGS. 3, 4B, and 5B, the peak wavelength of the second partial light L2-1 may be the same as the peak wavelength of the second incident light L2. The peak wavelength of the second output light L4 may be more biased to a longer wavelength, e.g., red, than the peak wavelength of the second incident light L2. A third difference W3 may exist between the peak wavelength of the second partial light L2-1 and the peak wavelength of the second output light L4. The third difference W3 may be greater than the second difference W2. This means that the second output light L4 may be more shifted to the red color than the first output light L1.

Referring to FIGS. 3, 4C, and 5C, a fourth difference W4 may exist between the peak wavelength of the front light L5 (obtained by mixing or combining the first partial light L1-1 and the first output light L3) and the peak wavelength of the inclined light L6 (obtained by mixing or combining the second partial light L2-1 and the second output light L4). The front light L5 may correspond to or constitute a portion of the second light that is obtained from or in response to the first incident light L1, and the inclined light L6 may correspond to or constitute a remaining portion of the second light obtained from or in response to the second incident light L2. In an implementation, the fourth difference W4 may be, e.g., about 2 nm. The fourth difference W4 may be smaller than the first difference W1. Thus, the blue color shift phenomenon in the image perceived by the user according to the viewing angle may be improved by the light emitting layer 170.

By way of summation and review, an organic light emitting display apparatus has been spotlighted as a next generation display device for its superior brightness and viewing angle. The organic light emitting display apparatus does not need to include a separate light source, and it has thin thickness and light weight. In addition, the organic light emitting display apparatus may have desirable properties, e.g., fast response speed, low power consumption, high brightness, etc.

A color shift may occur at a side viewing angle of an organic light emitting display apparatus due to an output angle of light exiting from the organic light emitting device.

The embodiments may provide an organic light emitting display apparatus that is capable of preventing a color shift from occurring at a side or wide viewing angle.

For example, the blue color shift phenomenon in the image perceived by the user according to the side viewing angle may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display apparatus, comprising:
   a substrate including a plurality of pixel areas;
   a pixel electrode on the substrate;
   an opposite electrode on the pixel electrode;
   an organic light emitting layer between the pixel electrode and the opposite electrode; and
   a light emitting layer on the organic light emitting layer,
   wherein the organic light emitting layer comprises a first organic light emitting layer and a second organic light emitting layer adjacent to the first organic light emitting layer, the first and second organic light emitting layers comprising a material to emit a first light having a same wavelength,
   wherein the light emitting layer comprises:
   a first light emitting layer on the first organic light emitting layer, the first light emitting layer comprising a material to absorb a portion of the first light and to emit a second light having a wavelength different from the wavelength of the first light; and
   a second light emitting layer on the second organic light emitting layer, the second light emitting layer comprising a material to absorb a portion of the first light and to emit a third light having a wavelength different from the wavelength of the first light and the wavelength of the second light.

2. The display apparatus as claimed in claim 1, wherein:
   the pixel areas include a red pixel area and a green pixel area,
   the first organic light emitting layer is at the red pixel area, and
   the second organic light emitting layer is at the green pixel area.

3. The display apparatus as claimed in claim 2, wherein each of the first organic light emitting layer and the second organic light emitting layer is configured to emit a blue colored light as the first light.

4. The display apparatus as claimed in claim 2, wherein the second light emitted from the first light emitting layer has a red color; and
   the third light emitted from the second light emitting layer has a green color.

5. The display apparatus as claimed in claim 1, wherein the first and second light emitting layers comprise a quantum dot.

6. The organic light emitting display apparatus as claimed in claim 5, wherein the quantum dot comprises at least one of a CdSe core/ZnS shell, a CdSe core/CdS shell, or an InP core/ZnS shell.

7. The organic light emitting display apparatus as claimed in claim 1, wherein the light emitting layer is on the opposite electrode.

8. The organic light emitting display apparatus as claimed in claim 7, further comprising a sealing layer on the light emitting layer, the sealing layer sealing the pixel electrode, the opposite electrode, the organic light emitting layer, and the light emitting layer.

9. An organic light emitting display apparatus, comprising:
   a substrate including a plurality of pixel areas;
   a plurality of pixel electrodes on the plurality of pixel areas of the substrate, respectively;
   an opposite electrode on the pixel electrodes;
   an organic light emitting layer between the pixel electrodes and the opposite electrode; and
   a light emitting layer on the opposite electrode,
   wherein the organic light emitting layer comprises a first organic light emitting layer, a second organic light emitting layer and a third organic light emitting layer adjacent to the first organic light emitting layer, the first and third organic light emitting layers comprising a material to emit a first light having a same wavelength,
   wherein the light emitting layer comprises:
   a first light emitting layer on the first organic light emitting layer, the first light emitting layer comprising a material to absorb a portion of the first light and to emit a second light having a wavelength different from the wavelength of the first light;

a second light emitting layer on the second organic light emitting layer, the second light emitting layer comprising a material to absorb a portion of the first light and to emit a third light having a wavelength different from the wavelength of the first light and the wavelength of the second light, and a third light emitting layer on the third organic light emitting layer, the third light emitting layer comprising a material to absorb a portion of the first light and to emit a fourth light having a same wavelength as the wavelength of the first light.

10. The display apparatus as claimed in claim 9, wherein:

the pixel areas include a red pixel area, a green pixel area, and a blue pixel area, the first organic light emitting layer is at the red pixel area, the second organic light emitting layer is at the green pixel area, and the third organic light emitting layer is at the blue pixel area.

11. The display apparatus as claimed in claim 10, wherein each of the first organic light emitting layer, the second organic light emitting layer, and the third organic light emitting layer is to emit a blue colored light as the first light.

12. The display apparatus as claimed in claim 10, wherein the second light emitted from the first light emitting layer has a red color, the third light emitted from the second light emitting layer has a green color, and the fourth light emitted from the third light emitting layer has a blue color.

13. The display apparatus as claimed in claim 9, wherein the first and second light emitting layers comprise a quantum dot.

\* \* \* \* \*